US 6,685,543 B2

United States Patent
Lai et al.

(10) Patent No.: US 6,685,543 B2
(45) Date of Patent: Feb. 3, 2004

(54) COMPENSATING CHEMICAL MECHANICAL WAFER POLISHING APPARATUS AND METHOD

(75) Inventors: Jer-Shyong Lai, Taipei (TW); Wen-Chueh Pan, Taipei (TW); Yang-Jiann Fann, Taoyuan (TW); Yih-Hsing Wang, Taiepi (TW); Chien-Cheng He, Taoyuan (TW); Chaug-Liang Hsu, Taipei (TW)

(73) Assignee: Chung Shan Institute of Science & Technology, Lungtan Shiang (TW)

( * ) Notice: Subject to any disclaimer, the term of this patent is extended or adjusted under 35 U.S.C. 154(b) by 65 days.

(21) Appl. No.: 10/117,088

(22) Filed: Apr. 8, 2002

(65) Prior Publication Data

US 2003/0100196 A1 May 29, 2003

(30) Foreign Application Priority Data

Nov. 26, 2001 (TW) ........................................ 90129167 A

(51) Int. Cl.[7] ................................................ B24B 7/30
(52) U.S. Cl. .................... 451/65; 451/285; 451/444; 438/690; 438/691; 438/692; 438/693
(58) Field of Search .............................. 451/65, 67, 72, 451/285, 290, 388, 398, 402, 444; 438/690–693

(56) References Cited

U.S. PATENT DOCUMENTS

| | | | | |
|---|---|---|---|---|
| 6,217,422 B1 | * | 4/2001 | Franca et al. .................. | 451/56 |
| 6,248,009 B1 | * | 6/2001 | Ito et al. ....................... | 451/444 |
| 6,270,392 B1 | * | 8/2001 | Hayashi et al. ................. | 451/5 |
| 6,399,499 B1 | * | 6/2002 | Lee ............................ | 438/692 |
| 6,444,583 B2 | * | 9/2002 | Aoki ........................... | 438/692 |
| 6,488,573 B1 | * | 12/2002 | Kobayashi et al. ......... | 451/285 |
| 6,491,836 B1 | * | 12/2002 | Kato et al. ..................... | 216/88 |
| 6,527,870 B2 | * | 3/2003 | Gotkis ............................ | 134/6 |
| 6,562,184 B2 | * | 5/2003 | Sommer ................. | 156/345.12 |
| 6,586,336 B2 | * | 7/2003 | Jeong ......................... | 438/692 |
| 2001/0045223 A1 | * | 11/2001 | Cho et al. .................. | 134/25.4 |
| 2002/0048958 A1 | * | 4/2002 | Kubo et al. ................. | 438/692 |

* cited by examiner

Primary Examiner—M. Rachuba
(74) Attorney, Agent, or Firm—Browdy and Neimark

(57) ABSTRACT

A compensating chemical mechanical wafer polishing apparatus and its related polishing method, which makes end point detection easy, minimizes slurry consumption, and requires less installation space and, in which a main polishing head of diameter smaller than the wafer and a compensating polishing head are used to polish the wafer, which is upwardly disposed in contact with the polishing heads. By means of the operation of the compensating polishing head to polish the wafer over the area where the main polishing head cannot effectively evenly polish, satisfactory polishing effect is achieved.

10 Claims, 10 Drawing Sheets

COMPENSATING CHEMICAL MECHANICAL WAFER POLISHING APPARATUS AND METHOD

BACKGROUND OF THE INVENTION

1. Field of the Invention

The present invention relates to a chemical mechanical wafer polishing technique and, more specifically, to a compensating chemical mechanical wafer polishing apparatus and method, which achieves a satisfactory, smooth polishing effect.

2. Description of the Related Art

According to conventional chemical mechanical wafer polishing techniques, the polishing face of the wafer is disposed downwards, and the polishing pad is disposed at the bottom side of the wafer and closely attached to the wafer carrier. The area of the polishing head is greater than the wafer. During polishing, the polishing head covers the whole area of the wafer. This polishing method has numerous drawbacks as outlined hereinafter.

1. High difficulty in end point detection: Because the polishing surface of the wafer faces downwards, the detection of the end point detect is indirectly operated, and the weak detection signal thus obtained must be processed further for reading. If detection is made through the polishing pad or the backside of the wafer, the technical difficulty and cost become high.
2. High consumption of slurry: Because of cover-all architecture, much slurry is used and applied to the broad polishing area of the polishing pad, and most of the slurry are utilized having not contribution to the polishing process, in the other hand, the expensive slurry is misspent. Thus the COO(Cost of ownership) will become high with no meaning.
3. Wafer edge effect: Because the polishing contact pressure is not changed continuously, the edge area polishing of the wafer is ground out significantly, resulting in an edge effect.
4. Bulk and heavy structure: Because of cover-all architecture, the diameter of the polishing head must be greater than the diameter of the wafer. In order to obtain the uniform velocity field on the wafer with the traditional CMP polishing method, the polishing table should be mush larger then the present invention. The heavy weight of the polishing head and platen requires a big scale of driving unit to achieve the desired polishing speed. Therefore, the polishing apparatus requires much installation space and heavy weight.

SUMMARY OF THE INVENTION

The present invention has been accomplished to provide a compensating chemical mechanical wafer polishing apparatus, which eliminates the aforesaid drawbacks. It is one object of the present invention to provide a compensating chemical mechanical wafer polishing apparatus, which lowers the difficulty of end point detection, and reduces the cost. It is another object of the present invention to provide a compensating chemical mechanical wafer polishing apparatus, which consumes less amount of polishing fluid, minimizing pollution to the environment and the COO. It is still another object of the present invention to provide a compensating chemical mechanical wafer polishing apparatus, which is compact and not heavy. It is still another object of the present invention to provide a compensating chemical mechanical wafer polishing apparatus, which provides a compensating polishing function to compensate the polishing of the main polishing head. The profile of copper plating on the wafer surface is too complicated to planarize without the dynamic control of different zone pressure with the help of EPD system when traditional CMP tool is utilized, and that is a highly cost and much difficult to compare with present invention. Most of the important things is that compensating method provided a workable method to solve the problem of wafer extension at the edge which is the biggest problem of the traditional CMP apparatus.

DETAILED DESCRIPTION OF THE PREFERRED EMBODIMENT

Figure 1:
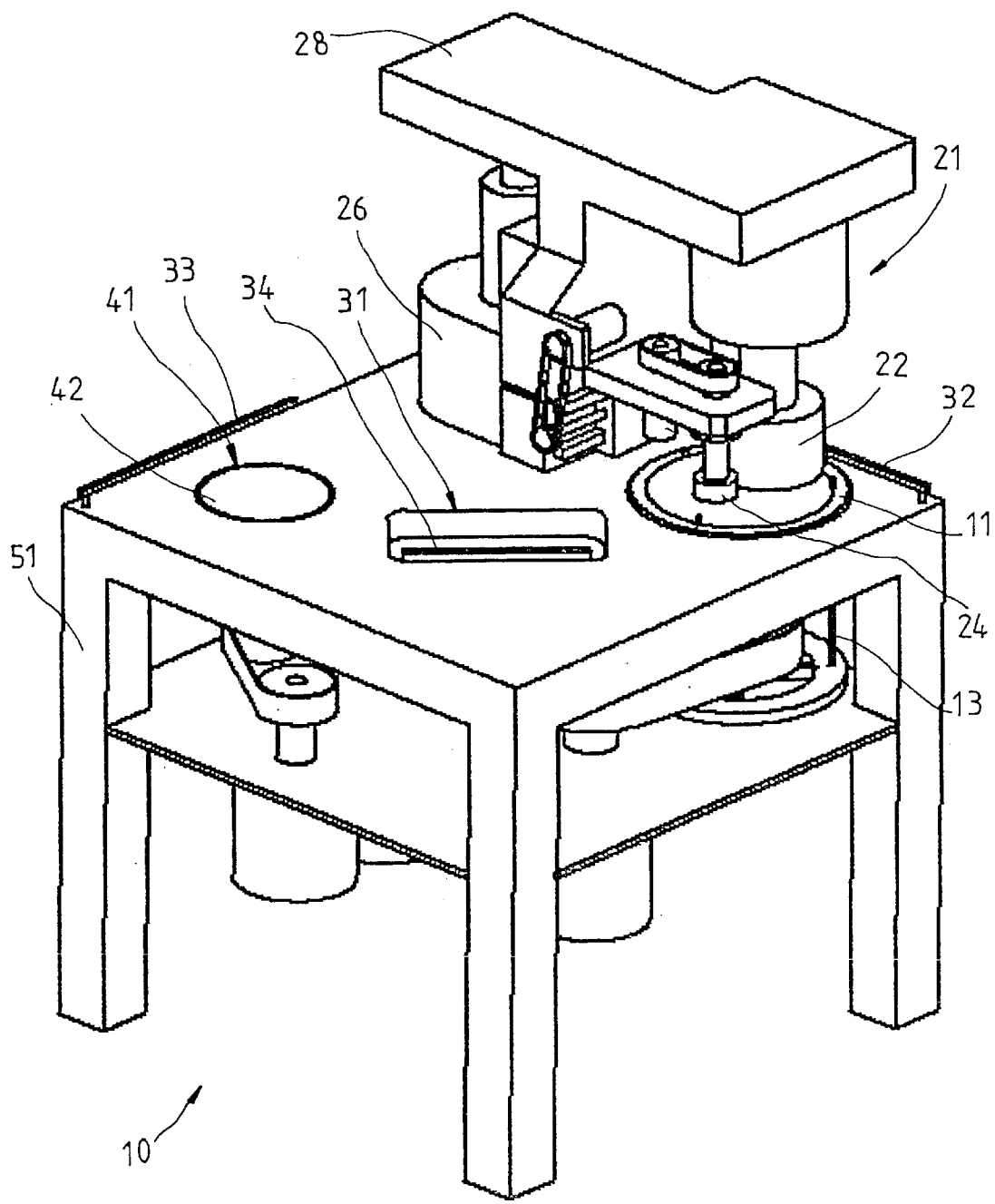
FIG. 1 is an elevational view of a compensating chemical mechanical wafer polishing apparatus constructed according to the present invention.
Figure 2:
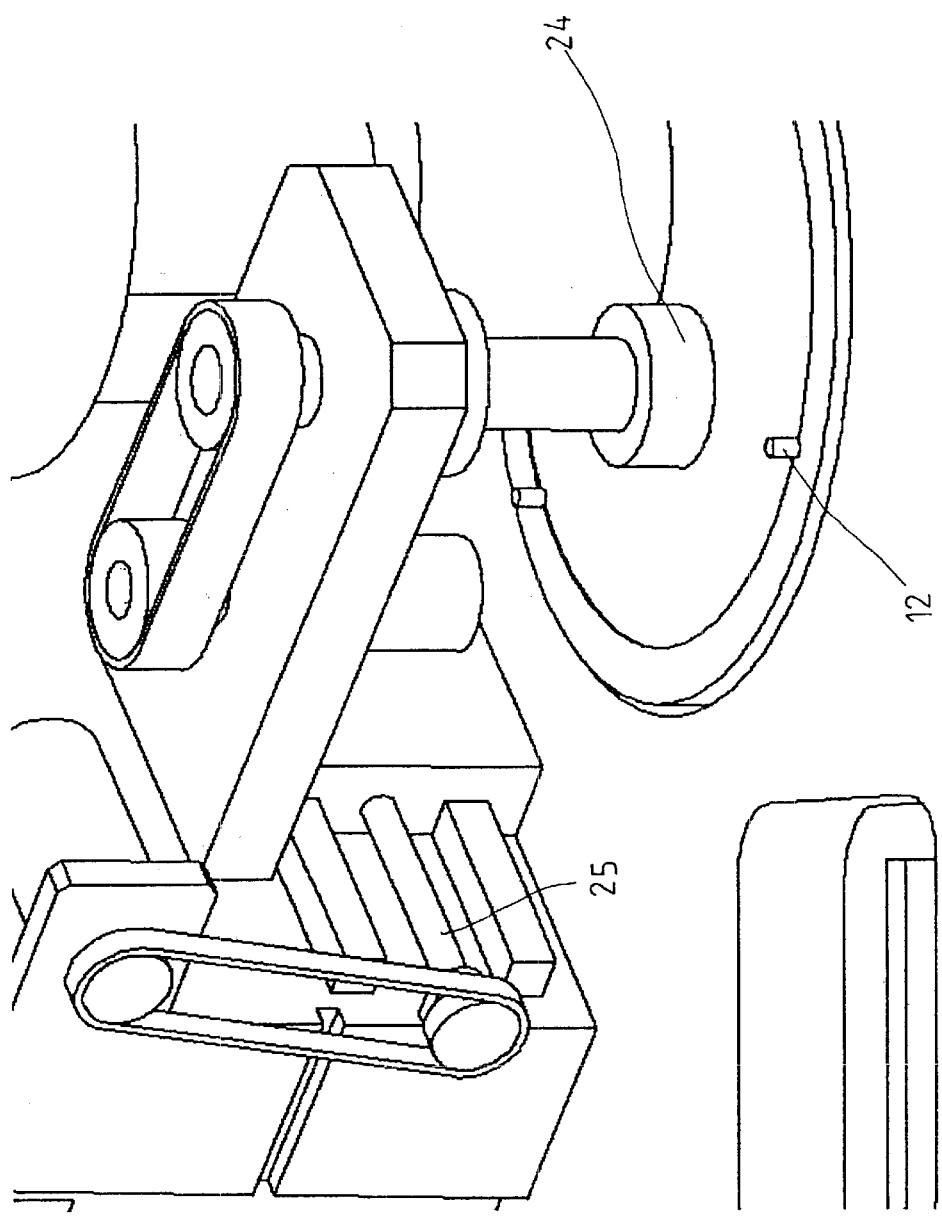
FIG. 2 is an enlarged view of a part of the compensating chemical mechanical wafer polishing apparatus shown in FIG. 1.

Referring to FIGS. from 1 through 4, a compensating chemical mechanical wafer polishing apparatus 10 is shown comprising a wafer carrier 11, a polishing module 21, a cleaning module 31, a pad conditional module 41, and a machine table 51.

The wafer carrier 11 comprises a bearing rod 12 supported on a lifting mechanism 13 and lifted to hold a wafer. The face of the wafer carrier 11 provides a vacuum suction function to suck the wafer during polishing.

The polishing module 21 comprises a main polishing head 22, and a compensating polishing head 24. The bottom polishing pad of the main polishing had 22 can be made having a circular, annular, polygonal, or oval shape, or the shape of a three-leaf, four-leaf, five-leaf, or any of a variety of polygonal configurations.

The main polishing head 22 has an inflatable air chamber 30 on the inside that can be inflated to impart a downward pressure.

The main polishing head 22 further comprises a fluid supply piping 27. During polishing, slurry is delivered from the fluid supply piping 27 through a perforated plate 29 and the polishing pad 23 and then directly ejected onto the polishing contact surface, preventing unnecessary waste. The compensating polishing head 24 is driven by a screw rod 25 to move back and forth relative transversely relative to the main polishing head 22. The pressure and speed of the compensating polishing head 24 are changed subject to the position of the compensating polishing head 24 to achieve a compensation polishing operation. The polishing module 21 is mounted on a lifting holder 28 that can be moved up and down. The holder 28 is connected to a swivel arm 26, which is controlled to move the lifting holder 28 between positions. The main polishing head 22 is a piston type polishing head. The compensating polishing head 24 can be a piston type (mechanical head), ultrasonic type, or electro-polishing type polishing head.

The cleaning module 31 comprises a wafer/wafer carrier cleaning water knife 32 and a pad conditional module cleaning water knife 33 disposed at two sides of the machine table 51, and a polishing head cleaning water knife 34 disposed in the middle of the machine table 51. When the polishing module 21 moved to a second position, the wafer/wafer carrier cleaning water knife 32 is driven to clean the processed wafer 99 and the wafer carrier 11, at the same time the polishing head cleaning water knife 34 is driven to clean the main polishing head 22 and the compensation polishing head 24, and at the same time the pad conditional module cleaning water knife 33 is driven to clean the diamond-dressing disk 42 of the pad conditional module 41, enabling slurry to be completely removed from the processed wafer 99, the main polishing head 22, the compensation polishing head 24, and the diamond-dressing disk 42 of the pad conditional module 41.

The diamond-dressing disk 42 of the pad conditional module 41 is provided at the top of the machine table 51. When the polishing module 21 moved to a third position, the diamond-dressing disk 42 is driven to trim the polishing pad 23. During pad conditioning, the fluid supply piping 27 is switched to deliver deionized water instead of slurry. The supply of deionized water simultaneously removes remaining slurry from the fluid supply piping 27.

Figure 3:
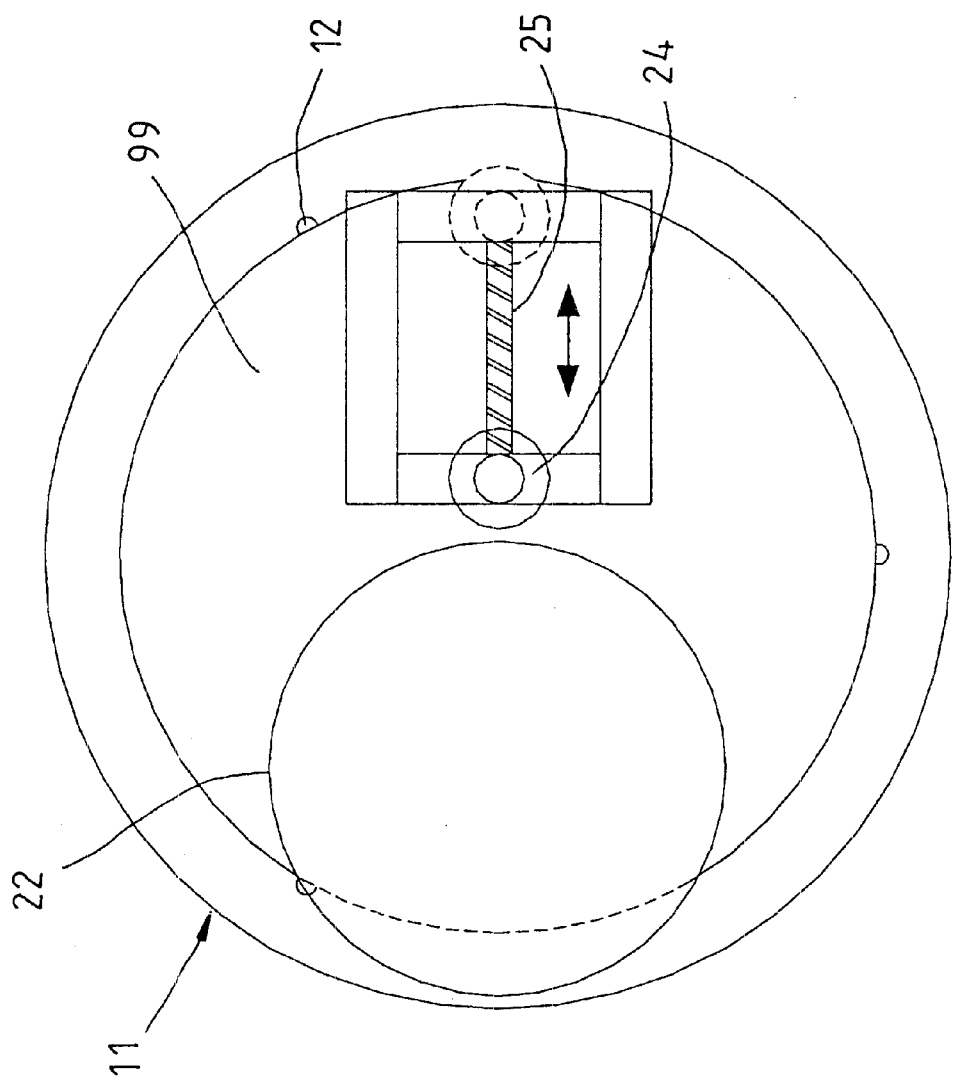
FIG. 3 is a schematic drawing showing a polishing status of the present invention.
Figure 4:
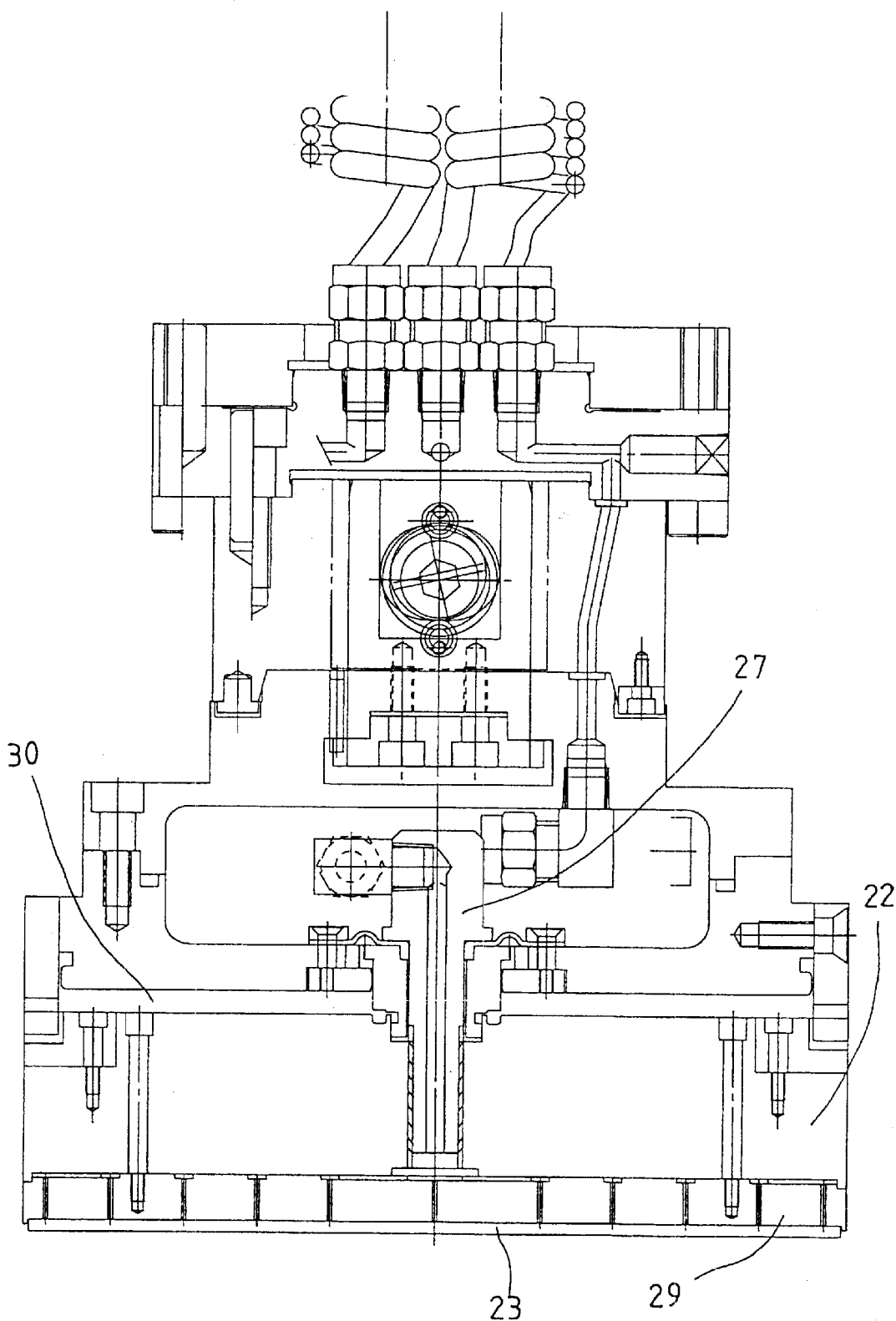
FIG. 4 illustrates the arrangement of the fluid supply piping in the main polishing head according to the present invention.
Figure 5:
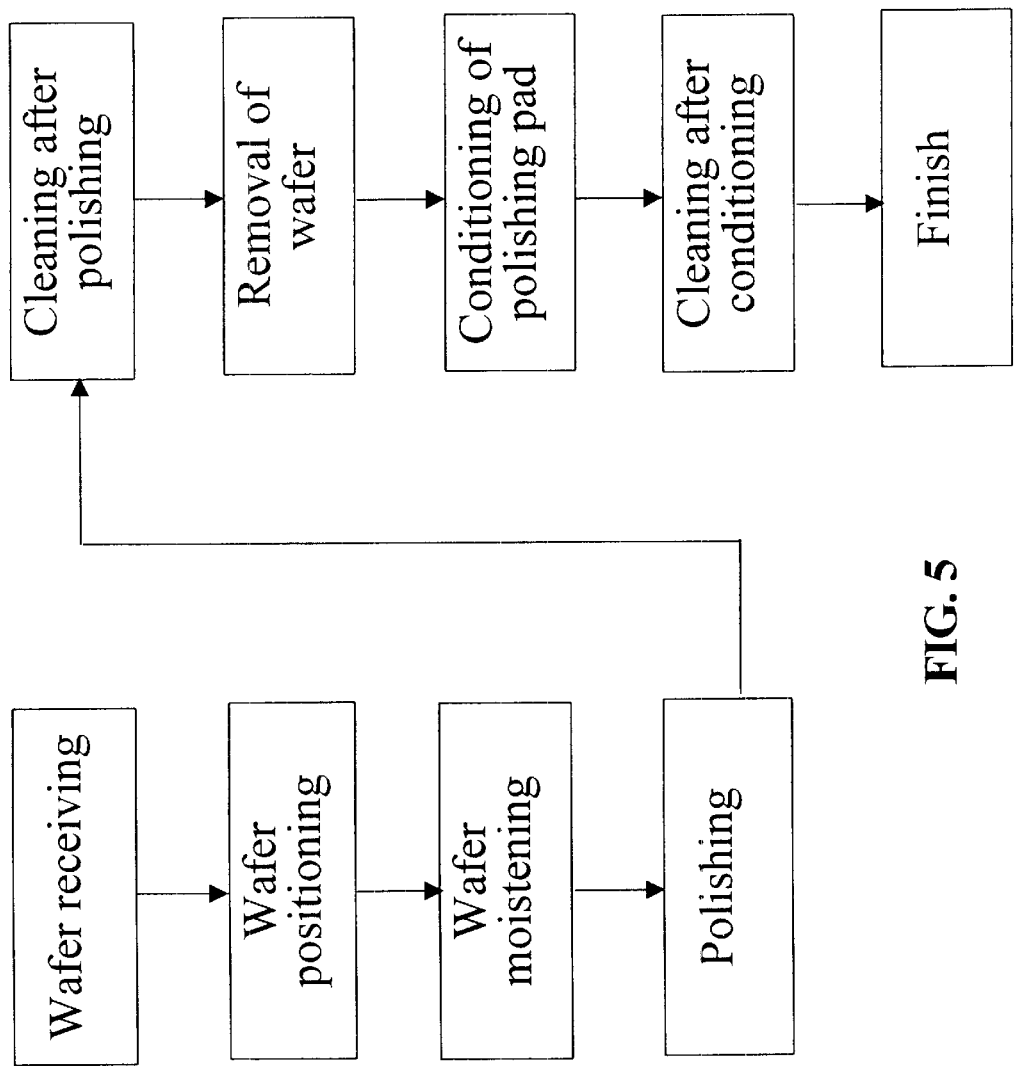
FIG. 5 is an operational block diagram of the present invention.
Figure 6A:
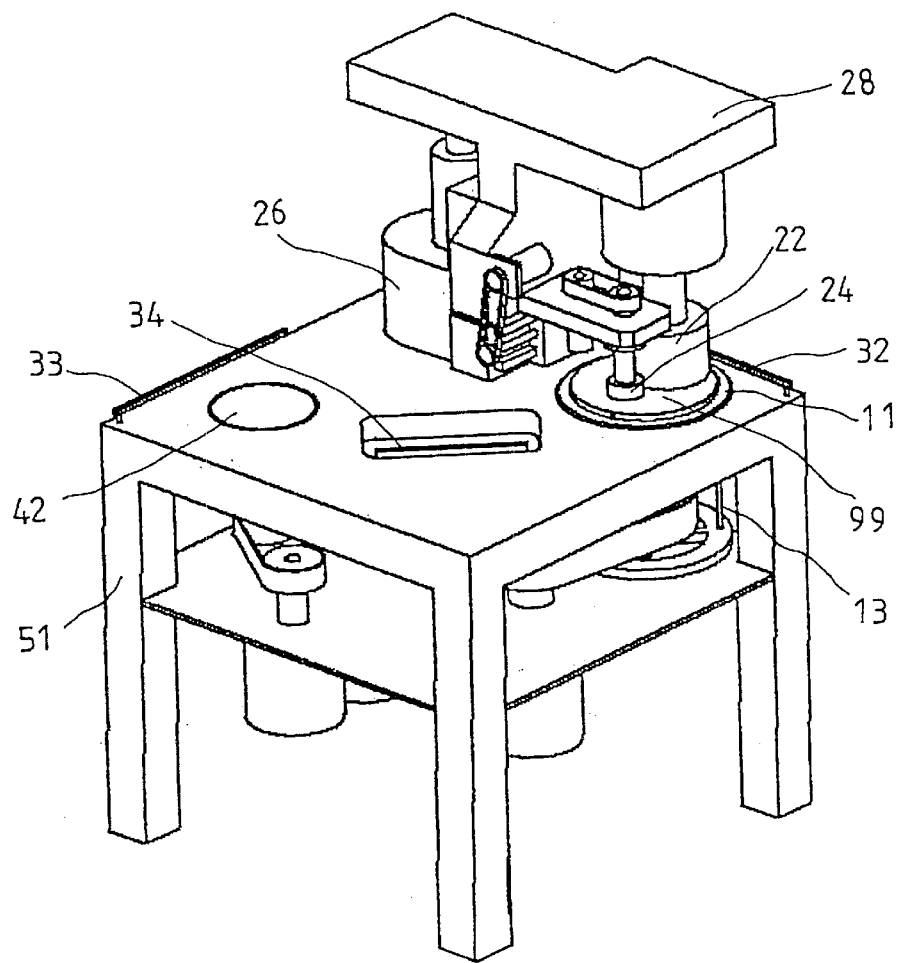
FIG. 6A illustrates a wafer receiving status of the present invention.
Figure 6B:
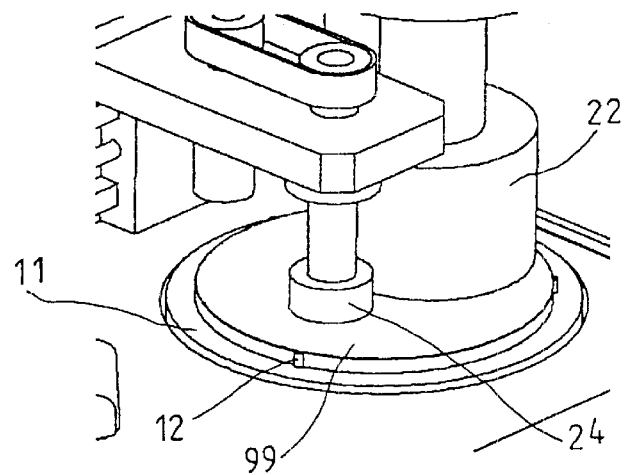
FIG. 6B is an enlarged view of a part of FIG. 6A.
Figure 7A:
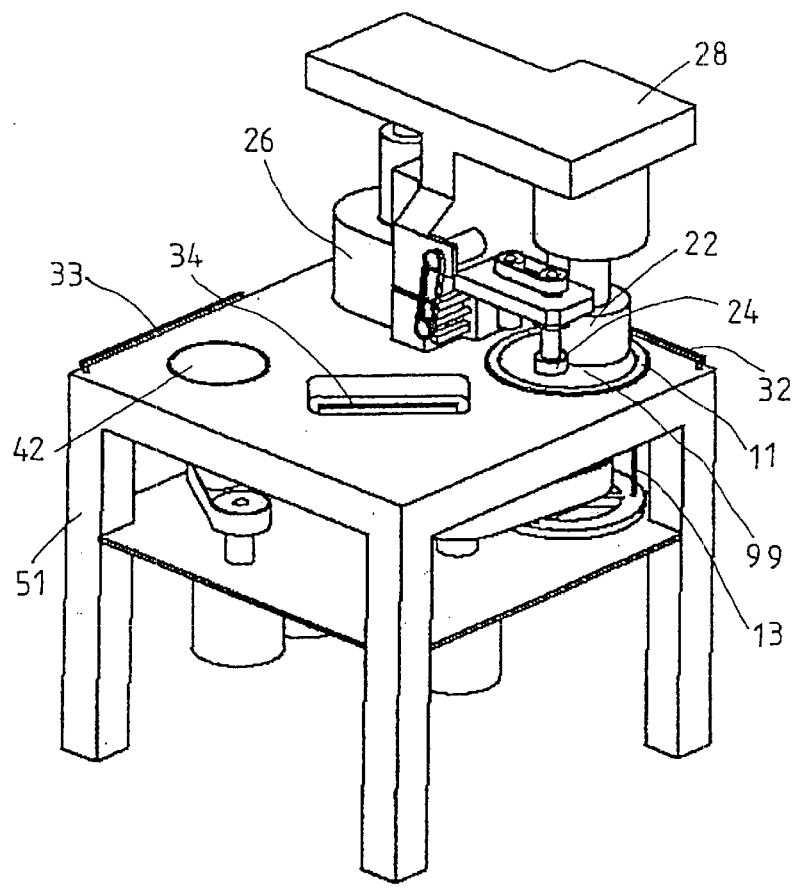
FIG. 7A illustrates a polishing status of the present invention.
Figure 7B:
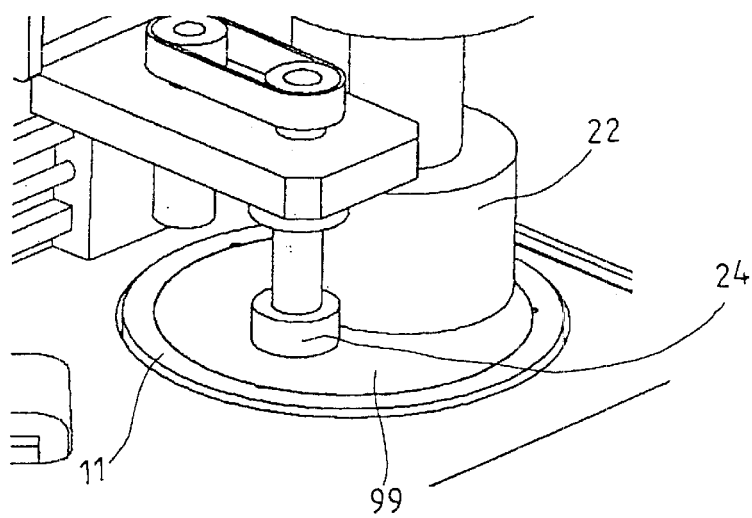
FIG. 7B is an enlarged view of a part of FIG. 7A.
Figure 8:
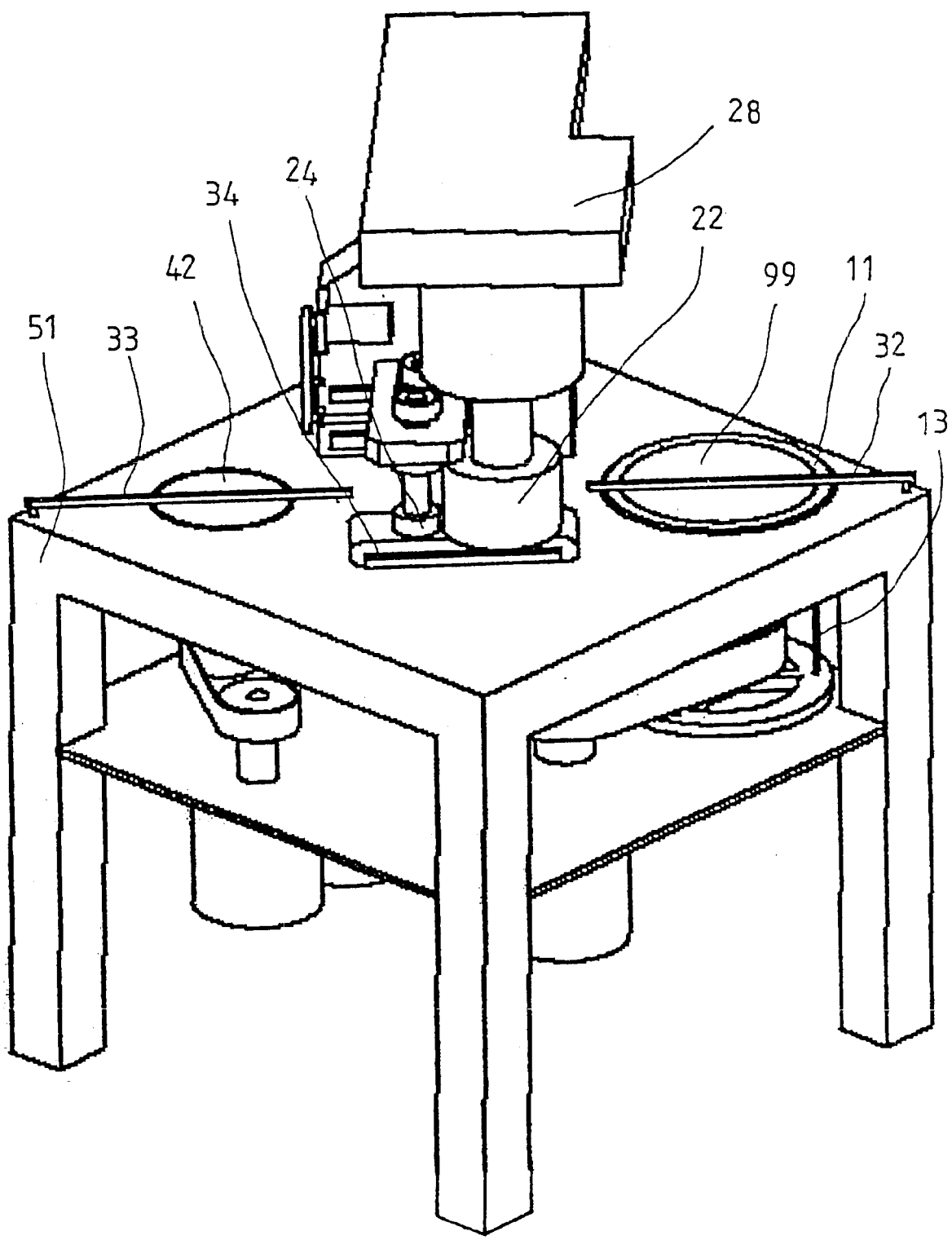
FIG. 8 illustrates a polishing head cleaning status of the present invention.
Figure 9:
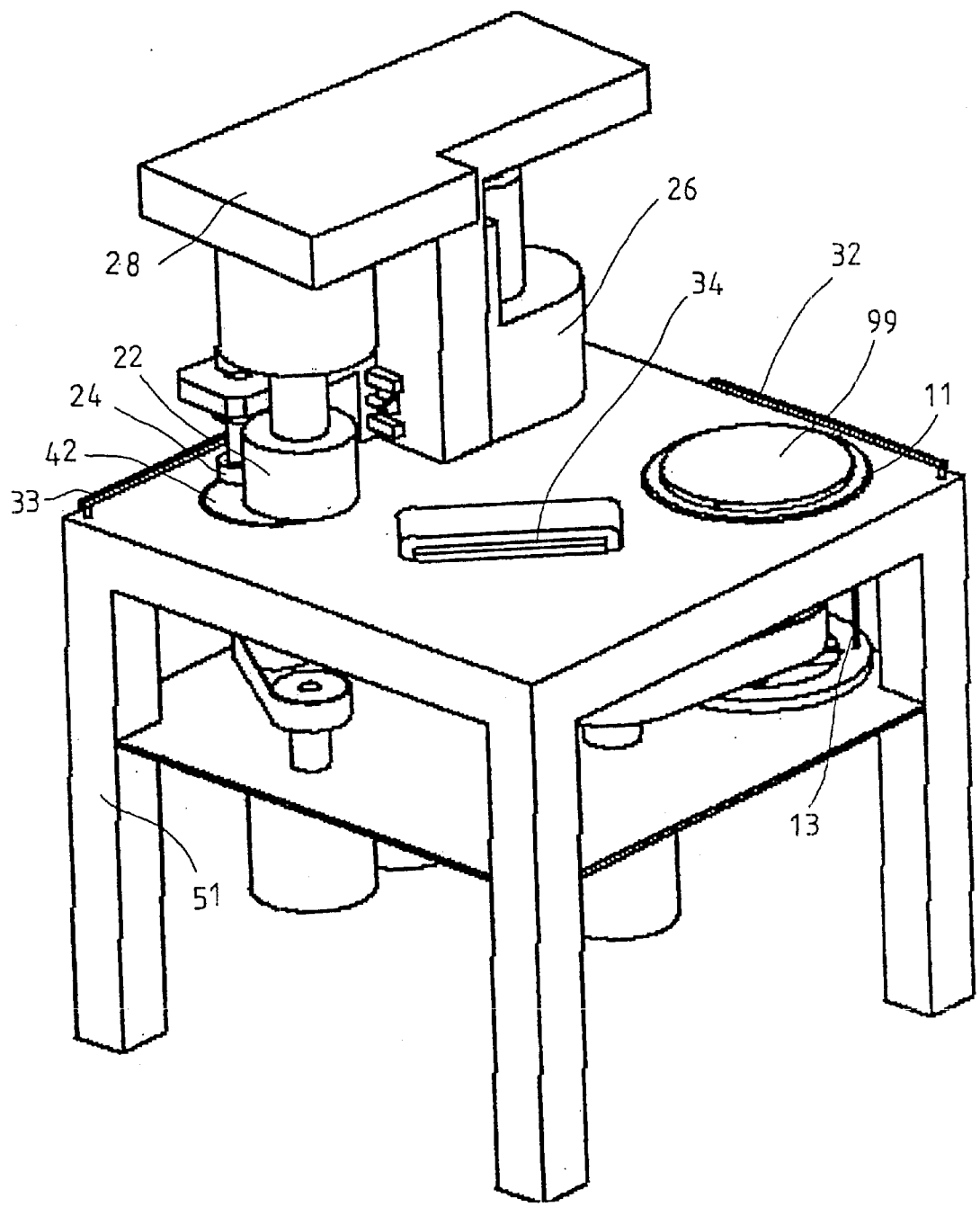
FIG. 9 illustrates the pad conditioning action of the pad conditional module of the compensating chemical mechanical wafer polishing apparatus according to the present invention.

Referring to FIGS. from 5 through 9, the operation of the compensating chemical mechanical wafer polishing apparatus 10 comprises the steps of:

A. Wafer receiving where the bearing rod 12 of the wafer carrier 11 is lifted to the wafer receiving position, and then wafer is placed on the bearing rod 12 as shown in FIG. 6;

B. Wafer positioning where the bearing rod 12 of the wafer carrier 11 is lowered to the lower limit position, and the vacuum suction function of the wafer carrier 11 is started to suck the loaded wafer;

C: Wafer moistening where the wafer/wafer carrier cleaning water knife 32 of the cleaning module 31 is operated to moisten the wafer;

D. Polishing where the polishing module 21 is turned to the position above the wafer 99 at the bearing rod 12 and then lowered to the polishing elevation as shown in FIG. 7, and then the internal inflatable air chambers of the polishing heads 22 and 24 are inflated to impart a downward pressure, and then the main polishing head 22 is controlled to deliver slurry from the fluid supply piping 27 to the polishing contact surface to polish the wafer 99, and at the same time the compensating polishing head 24 is moved with the main polishing head 22 and reciprocated by the screw rod 25 (see FIG. 3) to achieve a compensating polishing effect;

E. Cleaning after polishing where the polishing module 21 is moved to the cleaning position (the second position), and the water knives 32, 33 and 34 of the cleaning module 31 are operated to clean the wafer 99, the diamond-dressing disk 42, and the main and compensating polishing heads 22 and 24 respectively as shown in FIG. 8;

F. Wafer removal where the wafer carrier 11 is controlled to switch of vacuum suction function and to blow air, and then the bearing rod 12 is controlled to push out the wafer, and then the wafer carrier 11 is controlled to switch off air blowing valve, and then the bearing rod 12 is lowered to the lower limit position again after removal of the wafer;

G. Conditioning of polishing pad where the polishing module 21 is moved to the conditioning position (the third position), and then the diamond-dressing disk 42 of the pad conditional module 41 is operated to trim the bottom polishing pads 23 of the polishing heads 22 and 24, and the main polishing head 22 is switched to supply deionized water to carry remaining polishing fluid away from the fluid supply piping 27 as shown in FIG. 9;

H. Cleaning after conditioning where the polishing module 21 is moved to the cleaning position (the second position), and then the water knives 32, 33 and 34 of the cleaning module 31 are operated to clean the wafer carrier 11, the diamond-dressing disk 42, and the main and compensating polishing heads 22 and 24 respectively;

I. Finishing where the bearing rod 12 of the wafer carrier 11 is lifted to the wafer receiving position ready to receive a next wafer, i.e. returned to the status shown in FIG. 6.

As indicated above, by means of the compensating polishing head 24 to polish the wafer 99, the invention eliminates the problem of uneven velocity field of the main polishing head 22 and, can achieve a particular compensating polishing. For example, the invention eliminates the problem of edge effect that is commonly seen in conventional wafer polishing methods. In general, the polishing technique of the present invention uses the compensating polishing head 24 to achieve compensating polishing, resulting in a satisfactory polishing effect better than conventional cover-all polishing techniques.

Figure 10:
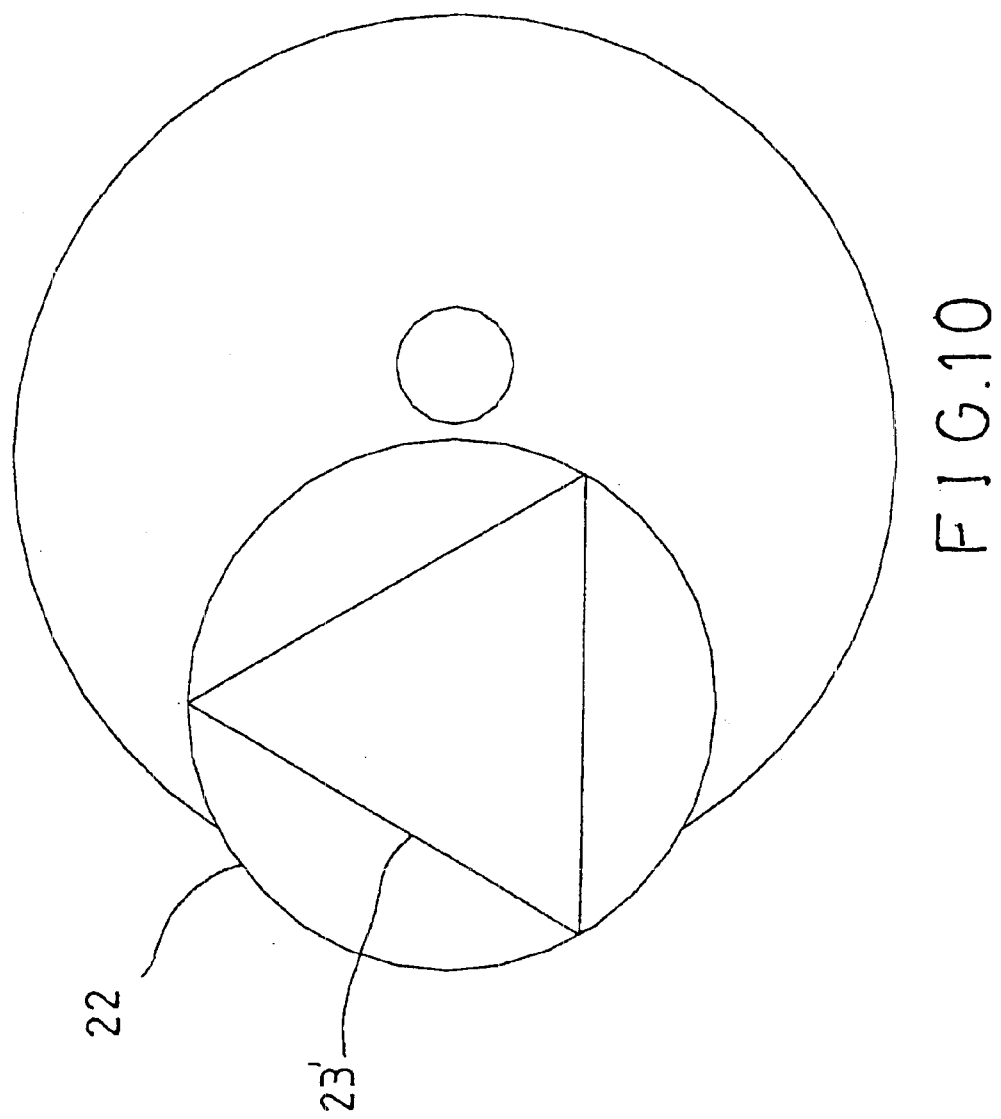
FIG. 10 illustrates the main polishing head equipped with a triangular polishing pad according to the present invention.

The polishing pad 23 at the bottom side of the main polishing head 22 can be made having a circular, annular, polygonal, or oval shape, or the shape of a three-leaf, four-leaf, five-leaf, or any of a variety of polygonal configurations, for example, the triangular shape as shown in FIG. 10. The triangular polishing pad 23' enhances the polishing around the center area rather than the side edge area, so as to achieve a different polishing effect.

The compensating polishing head 24 can be a piston type, ultrasonic type, or electro-polishing type polishing head subject to employed manufacturing process. When low stress polishing is required, it is preferable to use an ultrasonic type or electro-polishing type compensating polishing head.

As indicated above, the present invention achieve the following advantages:

1. Ease of end point detection: Because the wafer faces upwards and the polishing head does not cover the whole area of the wafer during polishing, the polishing head is not in the way of the detection of the end point detector, enabling the end point detector to directly detect the polishing surface of the wafer. Therefore, the technical difficulty and cost are relatively low.

2. Less consumption of slurry: Because slurry is directly supplied to the polishing contact surface, waste of slurry is eliminated. Therefore, the invention consumes less amount of slurry.

3. Less dimensions and weight: Because the diameter of the platen is about the radius of the wafer, and the polishing head is smaller than the wafer, the main polishing head and platen have less dimensions and weight than a cover-all polishing head and platen used in conventional designs. Due to compact design, the main polishing head can easily achieve high speed polishing, and the installation space of the machine table can be greatly reduced.

4. Compensating polishing: Because the compensating polishing head can polish the area where the main polishing head cannot effectively achieve, the invention achieves a better polishing effect than conventional methods.

5. Wide design selection range: In comparison with the conventional cover-all designs, the invention is feasible for low stress or non-stress polishing. This advantage is practical for the polishing of copper when low-k material of effective dielectric constant smaller than 2.0 is introduced to the integration with copper damascene process.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A compensating chemical mechanical wafer polishing apparatus comprising:
    a wafer carrier, said wafer carrier comprising a bearing rod movable in vertical direction;
    a polishing module, said polishing module comprising a main polishing head, a compensating polishing head, a screw rod controlled to reciprocate said compensating polishing head transversely relative to said main polishing head, the pressure and polishing speed of said compensating polishing head varying with the position change of said compensating polishing head to achieve compensating polishing; and
    a cleaning module, said cleaning module comprising a wafer/wafer carrier water knife, and a polishing head cleaning water knife adapted to clean the wafer and said wafer carrier, and the main polishing head and compensating polishing head of said polishing module.

2. The compensating chemical mechanical wafer polishing apparatus as claimed in claim 1, wherein said main polishing head comprises a polishing pad having one of triangular, circular, annular, polygonal, oval, three-leaf, four-leaf, and five-leaf shapes subject to the requirement for velocity field.

3. The compensating chemical mechanical wafer polishing apparatus as claimed in claim 1, wherein said polishing module is mounted on a swivel arm.

4. The compensating chemical mechanical wafer polishing apparatus as claimed in claim 3, wherein said polishing module is supported on a vertically movable lifting holder at said swivel arm.

5. The compensating chemical mechanical wafer polishing apparatus as claimed in claim 1, wherein said main polishing head is a piston type polishing head.

6. The compensating chemical mechanical wafer polishing apparatus as claimed in claim 1, wherein said compensating polishing head is a piston type polishing head.

7. The compensating chemical mechanical wafer polishing apparatus as claimed in claim 1, wherein said compensating polishing head is an ultrasonic type polishing head.

8. The compensating chemical mechanical wafer polishing apparatus as claimed in claim 1, wherein said compensating polishing head is an electro-polishing type polishing head.

9. The compensating chemical mechanical wafer polishing apparatus as claimed in claim 1 further comprising a pad conditional module, said pad conditional module comprising a diamond-dressing disk adapted to trim bottom polishing pad of said main polishing head and bottom polishing pad of said compensating polishing head.

10. A compensating chemical mechanical wafer polishing used in the compensating chemical mechanical wafer polishing apparatus of claims 1~9, comprising the steps of:

A. Wafer receiving where the wafer is placed on the bearing rod;

B. Wafer positioning where the bearing rod of the wafer carrier is lowered to the lower limit position, and a vacuum suction function of the wafer carrier is started to suck the loaded wafer;

C. Wafer moistening where the wafer/wafer carrier cleaning water knife of the cleaning module is operated to moisten the wafer;

D. Polishing where the main polishing head and compensating polishing head of the polishing module are controlled to impart a downward pressure, and then the main polishing head is controlled to deliver slurry to the polishing contact surface to polish the wafer, and at the same time the compensating polishing head is reciprocated relative to the main polishing head to achieve a compensating polishing effect;

E. Cleaning after polishing where the water knives of the cleaning module are operated to clean the wafer, the diamond-dressing disk, and the main and compensating polishing heads;

F. Wafer removal where the wafer carrier is controlled to stop the vacuum suction function and to blow air toward the wafer, and then the bearing rod is controlled to push out the water, and then the wafer carrier is controlled to stop blowing air, and then the bearing rod is lowered to the lower limit position again after removal of the wafer;

G. Conditioning of polishing pad where the diamond-dressing disk of the pad conditional module is operated to condition the bottom polishing pads of the main polishing head and compensating polishing head of the polishing module, and the main polishing head is switched to supply deionized water to carry remaining slurry away from fluid supply piping means;

H. Cleaning after conditioning where the water knives of the cleaning module are operated to clean the wafer carrier, the diamond-dressing polishing disk, and the main and compensating polishing heads respectively;

I. Finishing where the bearing rod of the wafer carrier is lifted to the wafer receiving position ready to receive a next wafer.

* * * * *